(12) United States Patent
Shchemelinin et al.

(10) Patent No.: US 10,145,944 B1
(45) Date of Patent: Dec. 4, 2018

(54) SYSTEM AND METHOD FOR LADAR-BASED OPTIC ALIGNMENT AND CHARACTERIZATION

(71) Applicant: KLA-Tencor Corporation, Milpitas, CA (US)

(72) Inventors: Anatoly Shchemelinin, Pleasanton, CA (US); Wei Zhao, Sunnyvale, CA (US); Daniel Scott, San Jose, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 603 days.

(21) Appl. No.: 14/703,664

(22) Filed: May 4, 2015

Related U.S. Application Data

(60) Provisional application No. 61/988,109, filed on May 2, 2014, provisional application No. 62/069,230, filed on Oct. 27, 2014.

(51) Int. Cl.
| | |
|---|---|
| G01C 3/08 | (2006.01) |
| G01S 7/497 | (2006.01) |
| G01S 17/42 | (2006.01) |

(52) U.S. Cl.
CPC ............ *G01S 7/4972* (2013.01); *G01S 17/42* (2013.01)

(58) Field of Classification Search
CPC ................................ G01S 7/4972; G01S 17/42
See application file for complete search history.

(56) References Cited

U.S. PATENT DOCUMENTS

| | | | |
|---|---|---|---|
| 7,064,817 B1 | 6/2006 | Schmitt et al. | |
| 7,741,618 B2 | 6/2010 | Lee et al. | |
| 7,773,205 B2 | 8/2010 | Cooper et al. | |
| 7,800,736 B2 | 9/2010 | Pack et al. | |
| 7,929,125 B2 | 4/2011 | Koehler et al. | |
| 7,982,661 B2 | 7/2011 | Beasley | |

(Continued)

FOREIGN PATENT DOCUMENTS

| | | |
|---|---|---|
| EP | 1602942 B1 | 7/2002 |
| EP | 2192433 B1 | 12/2012 |
| WO | 2013139347 A1 | 9/2013 |

OTHER PUBLICATIONS

Narasimha S. Prasad et al., Understanding beam alignment in a coherent lidar system, The Nature of Light: What are Photons? V, Proc. of SPIE, vol. 8832, 88320A, Oct. 1, 2013, p. 88320A-1-88320A-7.

(Continued)

*Primary Examiner* — Samantha K Abraham
(74) *Attorney, Agent, or Firm* — Suiter Swantz pc llo

(57) ABSTRACT

An optical alignment system includes a LADAR sub-system including: a laser source and a probe configured to deliver probe illumination from the laser source to a first optical surface of the optical system and an additional optical surface of the optical system. The probe is further configured to receive a first measurement signal from the first optical surface and an additional measurement signal from the additional optical surface of the optical system. The system also includes a detector configured to receive a first combined signal and an additional combined signal from an optical coupling assembly. The system further include a controller configured to determine a relative distance between the first optical surface and the additional optical surface based on the first combined signal or the additional combined signal.

15 Claims, 10 Drawing Sheets

(56) References Cited

U.S. PATENT DOCUMENTS

| | | |
|---|---|---|
| 8,582,087 B2 | 11/2013 | Kaufman et al. |
| 8,597,577 B2 | 12/2013 | Flagan et al. |
| 2002/0109829 A1 | 8/2002 | Hayes |
| 2008/0068613 A1* | 3/2008 | Kuchel ............. G01L 311/2441 356/496 |
| 2010/0128243 A1 | 5/2010 | Liebman et al. |
| 2011/0228248 A1* | 9/2011 | Lafarre ............... G03F 7/70341 355/72 |

OTHER PUBLICATIONS

Zeb W. Barber et al., Characterization of an actively linearized ultrabroadband chirped laser with a fiber-laser optical frequency comb, Optics Letters, vol. 36, No. 7, Apr. 1, 2011, pp. 1152-1154.

R. Huber et al., High speed frequency swept light source for Fourier domain OCT at 20kHz A-scan rate, Photonics West—Bios 2005, Coherence Domain Optical Methods and Optical Coherence Tomography in Biomedicine IX (BO114), Proceedings of SPIE, Apr. 2005, 3 pages.

Mohammad U. Piracha et al., Simultaneous ranging and velocimetry of fast moving targets using oppositely chirped pulses from a mode-locked laser, Optics Express, vol. 19, No. 12, May 24, 2011, pp. 11213-11219.

Roos Pa et al., Ultrabroadband optical chirp linearization for precision metrology applications, Optics Letters, vol. 34, No. 23, Dec. 1, 2009, pp. 3692-3694, Optical Society of America.

Zeb W. Barber, et al., Accuracy of active chirp linearization for broadband frequency modulated continuous wave ladar, Appl. Opt. 49, 213-219, Jan. 7, 2010, Optical Society of America.

\* cited by examiner

SYSTEM AND METHOD FOR LADAR-BASED OPTIC ALIGNMENT AND CHARACTERIZATION

PRIORITY

The present application claims priority under 35 U.S.C. § 119(e) to U.S. Provisional Patent Application Ser. No. 61/988,109, entitled LADAR-Based Method for Optic Alignment and Characterization, by Anatoly Shchemelinin, Wei Zhao and Daniel Scott, filed May 2, 2014, an application of which currently co-pending application(s) are entitled to the benefit of the filing date.

The present application claims priority under 35 U.S.C. § 119(e) to U.S. Provisional Patent Application Ser. No. 62/069,230, entitled LADAR-Based Method for Optic Alignment and Characterization, by Anatoly Shchemelinin, Wei Zhao and Daniel Scott, filed Oct. 27, 2014, an application of which currently co-pending application(s) are entitled to the benefit of the filing date. The above-referenced provisional patent applications are hereby incorporated by reference in their entirety.

TECHNICAL FIELD

The present disclosure generally relates to the alignment of optical systems, and, more particularly, to LADAR-based alignment and verification of performance of optical systems

BACKGROUND

Traditional methods of optical alignment include the use of an interferometer or image quality evaluation. VUV and EUV optics require unusually high accuracy alignment for image acquisition. In addition, optical stability in VUV and EUV systems are very high. Further, optical profiles of optical elements are traditionally measured using interferometry. Traditional interferometry allows for profile measurement on only flat or almost flat wavefronts. When measuring profiles of aspherical optical elements, such flat wavefronts fronts are not available. Therefore, it would be desirable to provide an apparatus, system and/or method that cures the defects identified above in the prior art.

SUMMARY

An apparatus for alignment of one or more optical elements of an optical system is disclosed. In one illustrative embodiment, the apparatus includes a LADAR sub-system. In another illustrative embodiment, the LADAR sub-system includes a laser source. In another illustrative embodiment, the LADAR sub-system includes a probe configured to deliver probe illumination from the laser source to a first optical surface of the optical system and an additional optical surface of the optical system. In another illustrative embodiment, the probe is further configured to receive a first measurement signal from the first optical surface and an additional measurement signal from the additional optical surface of the optical system. In another illustrative embodiment, the LADAR sub-system includes an optical coupling assembly configured to direct the probe illumination from the laser source to the probe. In another illustrative embodiment, the optical coupling assembly is further configured to combine the first measurement signal and the additional measurement signal from the probe with one or more reference signals from the laser source to form a first combined signal and an additional combined signal. In another illustrative embodiment, the LADAR sub-system includes a detector configured to receive the first combined signal and the additional combined signal from the optical coupling assembly. In another illustrative embodiment, the apparatus includes a controller communicatively coupled to the detector. In one illustrative embodiment, the controller is configured to receive one or more electronic signals from the detector indicative of at least one of the first combined signal or the additional combined signal. In another illustrative embodiment, the controller is further configured to determine a relative distance between the first optical surface and the additional optical surface based on the received one or more electronic signals from the detector indicative of at least one of the first combined signal or the additional combined signal.

An apparatus for characterization of one or more reflective optical elements of an optical system is disclosed. In one illustrative embodiment, the apparatus includes a LADAR sub-system configured to generate a probe beam. In another illustrative embodiment, the apparatus includes a scattering target. In another illustrative embodiment, the apparatus includes a beam splitter configured to split the probe beam into a reference beam and a measurement beam. In one illustrative embodiment, the beam splitter is arranged to direct the reference beam to the scattering target. In another illustrative embodiment, the beam splitter is arranged to direct the measurement beam to an optical element. In another illustrative embodiment, the optical element is a reflective optical element of the optical system. In another illustrative embodiment, the optical element is configured to direct the measurement beam to the scattering target. In another illustrative embodiment, the measurement beam and the reference beam form an interference pattern at the surface of the scattering target. In another illustrative embodiment, the illumination from the interference pattern is scattered by the surface of the scattering target. In another illustrative embodiment, the apparatus includes a detector configured to image the interference pattern using the illumination scattered from the surface of the scattering target. In another illustrative embodiment, the apparatus includes a controller communicatively coupled to the detector. In one illustrative embodiment, the controller is configured to receive imagery data of one or more interference patterns scattered from the surface of the scattering target. In another illustrative embodiment, the controller is configured to determine a shape of the optical element based on the received imagery data of one or more interference patterns scattered from the surface of the scattering target.

It is to be understood that both the foregoing general description and the following detailed description are exemplary and explanatory only and are not necessarily restrictive of the present disclosure. The accompanying drawings, which are incorporated in and constitute a part of the specification, illustrate subject matter of the disclosure. Together, the descriptions and the drawings serve to explain the principles of the disclosure.

BRIEF DESCRIPTION OF THE DRAWINGS

The numerous advantages of the disclosure may be better understood by those skilled in the art by reference to the accompanying figures in which.

DETAILED DESCRIPTION

Reference will now be made in detail to the subject matter disclosed, which is illustrated in the accompanying drawings.

FIGS. 1A through 4B illustrate embodiments of a system and method for LADAR-based optical alignment and characterization, in accordance with one or more embodiments of the present disclosure. Embodiments of the present disclosure are directed to the alignment and characterization of imaging and non-imaging optical systems requiring high precision alignment, such as, but not limited to, VUV (vacuum ultraviolet) and EUV (extreme ultraviolet) optical systems (e.g., lithography systems, inspection systems or metrology systems). Additional embodiments provide for alignment monitoring and feedback control (e.g., real-time or near real-time) of one or more optical elements of an optical system. Additional embodiments of the present disclosure provide for the optical measurement and characterization of the shape of arbitrarily shaped objects, such as aspheric optical elements.

Figure 1A:
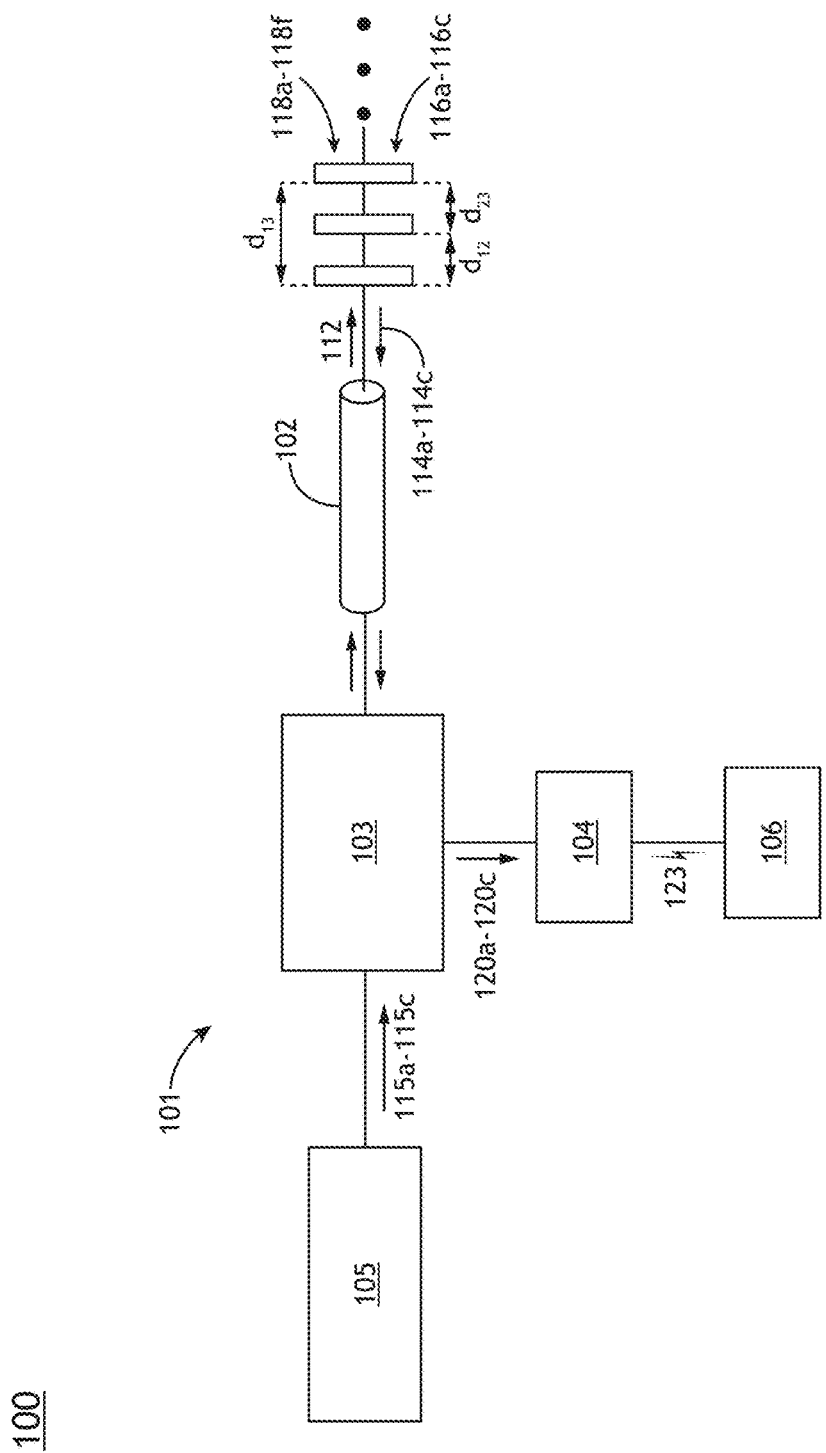
FIG. 1A is a block diagram illustrating a LADAR-based optical alignment system, in accordance with an embodiment of this disclosure.

FIG. 1A illustrates a block diagram view of an optical alignment system 100, in accordance with one or more embodiments of the present disclosure. In one embodiment, the system 100 includes a LADAR-based sub-system 101, or LADAR system, for measuring a relative distance between one or more reference optical surfaces and one or more additional optical surfaces of an optical system.

The implementation of LADAR-based techniques are described in Z. W. Barber, W. R. Babbitt, B. Kaylor, R. R. Reibel, and P. A. Roos, "*Accuracy of active chirp linearization for broadband frequency modulated continuous wave ladar*," Applied Optics, vol. 49, pp. 213-219, 2010, which is incorporated herein by reference in the entirety. LADAR-based techniques are also described by P. A. Roos, R. R. Reibel, B. Kaylor, T. Berg, Z. W. Barber, and W. R. Babbitt, "*Ultra-broadband optical chirp linearization for precision metrological applications*," Optics Letters, vol. 34, pp. 3692-3694, 2009, which is incorporated herein by reference in the entirety. LADAR-based techniques are also described in Z. W. Barber, R. Reibel, P. Roos, et al., "*Characterization of an Actively Linearized Ultra-Broadband Chirp Laser with a Fiber-Laser Optical Frequency Comb*", Optics Letters, vol. 36, pp. 1152-1154, 2011, which is incorporated herein by reference in the entirety. The term LADAR is used throughout the present disclosure to refer to the use of "Laser Detection And Ranging" system or sub-system. Those skilled in the art, at times, may also refer to this technology as Light Detection and Ranging (or LIDAR). It is noted herein that the present disclosure should be interpreted to encompass both terms and is not limited to a particular naming convention.

Figure 1B:
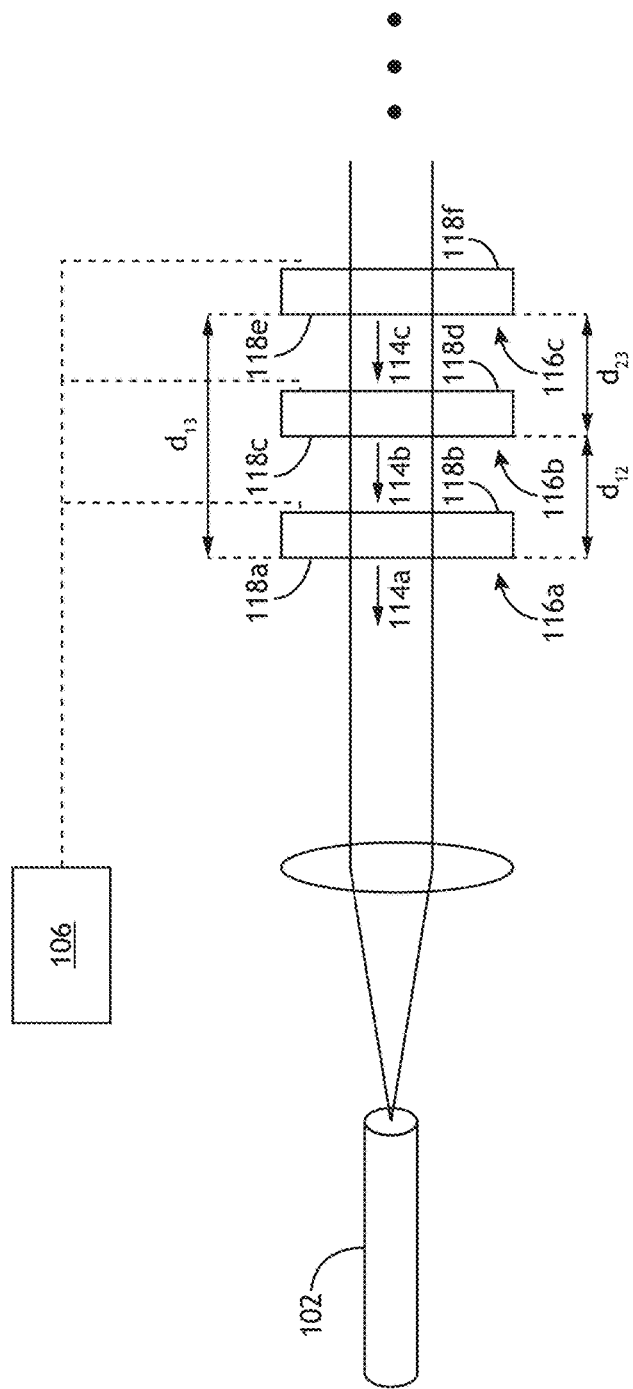
FIG. 1B is a block diagram illustrating a LADAR-based optical alignment system with feedback control, in accordance with an embodiment of this disclosure.

In one embodiment, the LADAR system 101 includes a laser source 105, an optical coupling assembly 103, a probe 102 and a detector 104. In one embodiment, the optical coupling assembly 103 is configured to direct probe illumination 112 from the laser source 105 to the probe 102. In another embodiment, the probe 102 is configured to receive one or more measurement signals from multiple optical surfaces (e.g., surfaces of optical elements 116a-116c, which depict a conceptual view of a set of optical elements of an optical system). In one embodiment, the probe 102 is configured to receive a first measurement signal from a first optical surface and an additional measurement signal from an additional optical surface of an optical system. For example, in the case of the optical elements 116a-116c depicted in FIG. 1A, the probe 102 may acquire measurement signals reflected or scattered from any of the six optical surfaces 118a-118f of the optical elements (e.g., two optical surfaces for each optical element 116a-116c). In one embodiment, any one of the optical surfaces 118a-118f may serve as a reference surface for determining a relative distance of an additional optical surface. In this regard, LADAR-based distance or range analysis may be implemented in order to measure the distance to any of the optical surfaces 118a-118f of the optical elements 116a-116c as well as the relative distance of any optical surface 118a-118f to the selected reference optical surface. It is further noted that, in the case of transmissive optical elements, as shown in FIGS. 1A and 1B, the probe illumination 112 may be transmitted along an optical pathway through one or more of the optical elements 116a-116c, allowing the LADAR-based system 101 to measure the relative distance between any two or more of these transmissive surfaces 118a-118f. For example, as depicted in FIG. 1B, the LADAR system 101 may measure a first distance $d_{12}$ between a surface 118a of the first optical element 116a and first surface 118c of the second optical element 116b. By way of another example, also depicted in FIG. 1B, the LADAR system 101 may measure a second distance $d_{23}$ between a first surface 118c of the second optical element 116b and the first surface 118e of the third optical element 116c. By way of another example, also depicted in FIG. 1B, the LADAR system 101 may measure a third distance $d_{13}$ between a first surface 118a of the first optical element 116a and the first surface 118e of the third optical element 116c. In another embodiment, the system 100 may include any number of optical elements, such as, but not limited to, one or more lenses as depicted in FIG. 1B.

It is noted herein that the optical configuration 116a-116c is provided merely for illustrative purposes and is not a limitation on the present disclosure. It is recognized herein that the use of LADAR sub-system 101 may be extended to any number of optical configurations including multiple optical surfaces.

In another embodiment, the optical coupling assembly 103 is configured to combine the first measurement signal and the additional measurement signal from the probe 102 with one or more reference signals from the laser source 105 to form a first combined signal 120a and an additional combined signal 120b. For example, as shown in FIGS. 1A and 1B, the probe 102 may receive or collect a first measurement signal 114a, a second measurement signal 114b and/or a third measurement signal 114c. Further, the optical coupling assembly 103 may be arranged to combine the first measurement signal 114a with a first reference signal 115a from the laser 105, the second measurement signal 114b with a second reference signal 115b from the laser 105, and the third measurement signal 114c with a third reference signal 115c (and so on) from the laser 105 to form the first combined signal 120a, a second combined signal 120b, and a third combined signal 120c (and so on). In one embodiment, one of the measurement signals 114a, 114b, 114c may be utilized as a reference signal to determine the relative distance between the associated optical surface and another optical surface (e.g., test surface) of the given optical system. For example, as shown in FIGS. 1A and 1B, in the case where optical surface 118a is deemed the reference surface, the signal 114a reflected or scattered from the optical surface 118a may be used as a reference signal to determine the relative distance between the optical surface 118a of element 116a and one or more additional optical surfaces, such as surfaces 118c and/or 118e.

In this example, surfaces 118c and/or 118e may be interpreted as test surfaces, with the surface 118a being interpreted as a reference surface. In one embodiment, one or more of the optical surfaces 118a-118f are selected as a reference surface during analysis of the positioned and/or alignment of the optical system and forms an operation portion of the optical system. In another embodiment, one or more of the optical surfaces 118a-118f are a dedicated reference surface placed within or proximate to the given optical system for the purpose of positional and/or alignment analysis of one or more optical elements of the optical system.

It is noted herein that this combination of measurement signals and reference signals may be extended to any number of measured optical surfaces of a given optical system and is not limited to the optical elements 116a, 116b and 116c depicted in FIGS. 1A and 1B. The remainder of the present disclosure will describe a number of additional embodiments of the procedure.

In one embodiment, the detector 104 is configured to receive the first combined signal and the additional combined signal from the optical coupling assembly 103. In this regard, the detector 104 is optically coupled to the output of the optical coupling assembly 103 in any manner known in the art. For example, the optical coupling assembly 103 may include, but is not required to include, one or more fiber optic outputs optically coupled to the detector 103, whereby the combined signals are delivered to the detection portion of the detector 103 via one or more optical fibers (e.g., single optical fiber or a bundle of optical fibers). By way of another example, the optical coupling assembly 103 may include, but is not required to include, one or more outputs optically coupled to the detector 103 via a free space coupling configuration, whereby the combined signals are delivered to the detection portion of the detector 103 via free space transmission. In the example depicted in FIG. 1A, the detector 104 is configured to receive the first combined signal 120a, the second combined signal 120b and the third combined signal 120c from the optical coupling assembly 103. It is noted herein that the system 100 and LADAR sub-system 101 of the present disclosure is not limited to the signal combing steps described herein. Rather, it is noted that the system 100 and sub-system 101 may be extended to any procedure used in the context of LADAR to measure the relative distance to a test surface from a reference surface and the absolute distance to a test surface.

The detector 104 may include any photodetector known in the art. For example, the detector may include, but is not limited to, one or more photodiodes, one or more CCDs (charge-coupled devices), one or more TDI-CCDs (time delay integration-charge coupled devices) or one or more PMTs.

The laser source 105 of system 100 may include any laser source known in the art. For example, the laser source 105 may include, but is not limited to, a photodiode, a CCD (charge-coupled device), a TDI-CCD (time delay integration-charge-coupled device) or a photomultiplier tube. It is noted herein that the system 100 is not limited to a laser source and it is contemplated that the system 100 may be extended to any coherent light source known in the art.

In another embodiment, the system 100 includes a controller 106 communicatively coupled to the output of the detector 104. In this regard, the controller 106 is configured to receive one or more electronic signals 123 from the detector indicative of at least one of the first combined signal or the additional combined signal. For example, the controller 106 may receive, but is not required to receive, one or more electronic signals indicative of combined signals 120a-120c.

In another embodiment, the controller 106 may execute program instructions suitable for determining a relative distance between the first optical surface and the additional optical surface based on the received one or more electronic signals from the detector 104 indicative of at least one of the first combined signal or the additional combined signal. For example, in the case depicted in FIGS. 1A and 1B, the controller 106 may execute program instructions suitable for determining a relative distance between two or more of 118a, 118c and 118e based on the received one or more electronic signals from the detector 104 indicative of at least one of the first combined signal 120a, the second combined signal 120b and the third combined signal 120c respectively. In one embodiment, the controller 106 may determine a relative distance $d_{12}$ between surface 118a and surface 118c by comparing the combined signal 120a to the combined signal 120b. In another embodiment, the controller 106 may determine a relative distance $d_{23}$ between surfaces 118c and 118e by comparing the combined signal 120b to the combined signal 120c. In another embodiment, the controller 106 may determine a relative distance $d_{13}$ between surfaces 118a and 118e by comparing the combined signal 120a to the combined signal 120c. It is noted that this process may be extended to any set of optical surfaces of an analyzed optical sensor and is not limited to the configuration depicted in FIGS. 1A and 1B.

In another embodiment, the controller 106 is further configured to identify a misalignment between the first optical surface and the additional optical surface based on the determined relative distance between the first optical surface and the additional optical surface. For example, as shown in FIGS. 1A and 1B, the controller 106 may determine a misalignment between optical elements 116a-116c based on the determined distances $d_{12}$, $d_{23}$ and/or $d_{13}$ (and so on) and knowledge of the expected alignment/positioning of the given optical system.

In another embodiment, the LADAR-based sub-system 101 may be used to measure an absolute distance from one or more components of the LADAR sub-system 101 to one or more optical surfaces of the optical system relative to a reference mirror within the LADAR-based sub-system 101 itself. It is noted herein that in order to determine an absolute distance to one or more optical surfaces of the optical elements 116a-116c the index of refraction associated with the transmission medium of the optical elements may be entered into the controller 106.

In another embodiment, as shown in FIG. 1B, one or more of the optical elements 116a-116c may be, but are not required to be, adjustable and may be adjusted by the controller 106 in response to a determination of a misalignment between two or more of the optical elements 116a-116c. For example, one or more optical elements may be, but are not required to be, disposed on an actuation stage. It is noted herein that the actuation stage is not explicitly depicted in FIG. 1B for purposes of clarity. An actuation stage extendable to FIG. 1B is depicted in FIGS. 2B and 3B. In one embodiment, the one or more actuation stages are communicatively coupled to the controller 106. In this regard, the controller 106 may direct the actuation stage (e.g., one or more translation and/or one or more rotational stages) to actuate one or more of the optical elements 116a-116c in order to adjust a position (or orientation) of at least one of a first optical surface or an additional optical surface of the elements 116a-116c to compensate for a detected misalignment. The detected misalignment is based on the relative distance determined between two or more of the optical faces (e.g., 118a-118f) of the optical elements 116a-116c of the given optical system. In another embodiment, the one or more optical elements 116a-116c may include one or more adaptive optical elements that may be adjusted by the controller 106 in order to compensate for the detected misalignment. For example, one or more of the optical elements 116a-116c may include an adjustable micro mirror-array, such as, but not limited to, a digital micromirror device, which may be actively controlled by the controller 106 so as to adjust for any measurement misalignment between the optical elements 116a-116c.

Figure 1C:
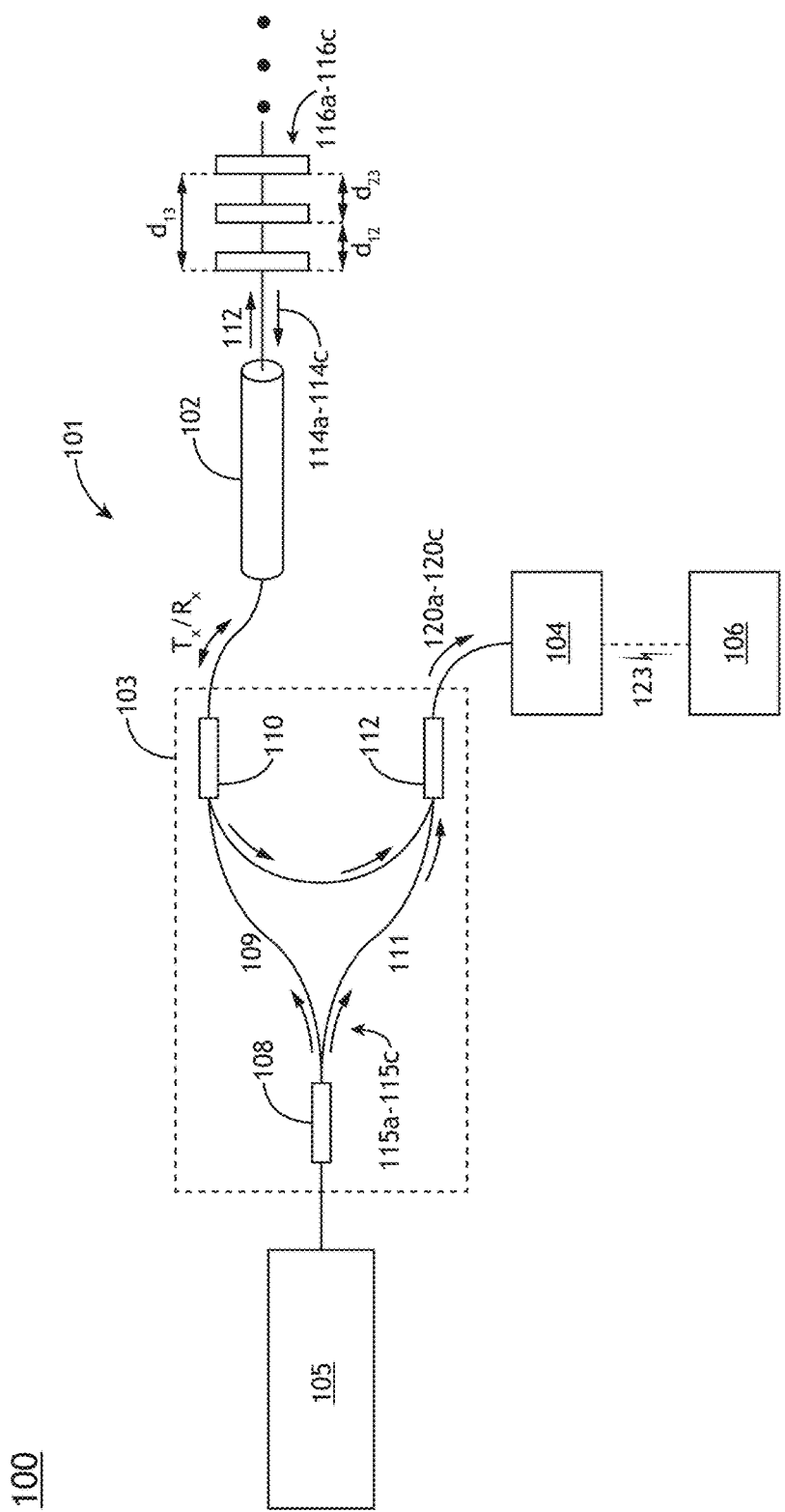
FIG. 1C is a block diagram illustrating a LADAR-based optical alignment system, in accordance with an embodiment of this disclosure.
Figure 1D:
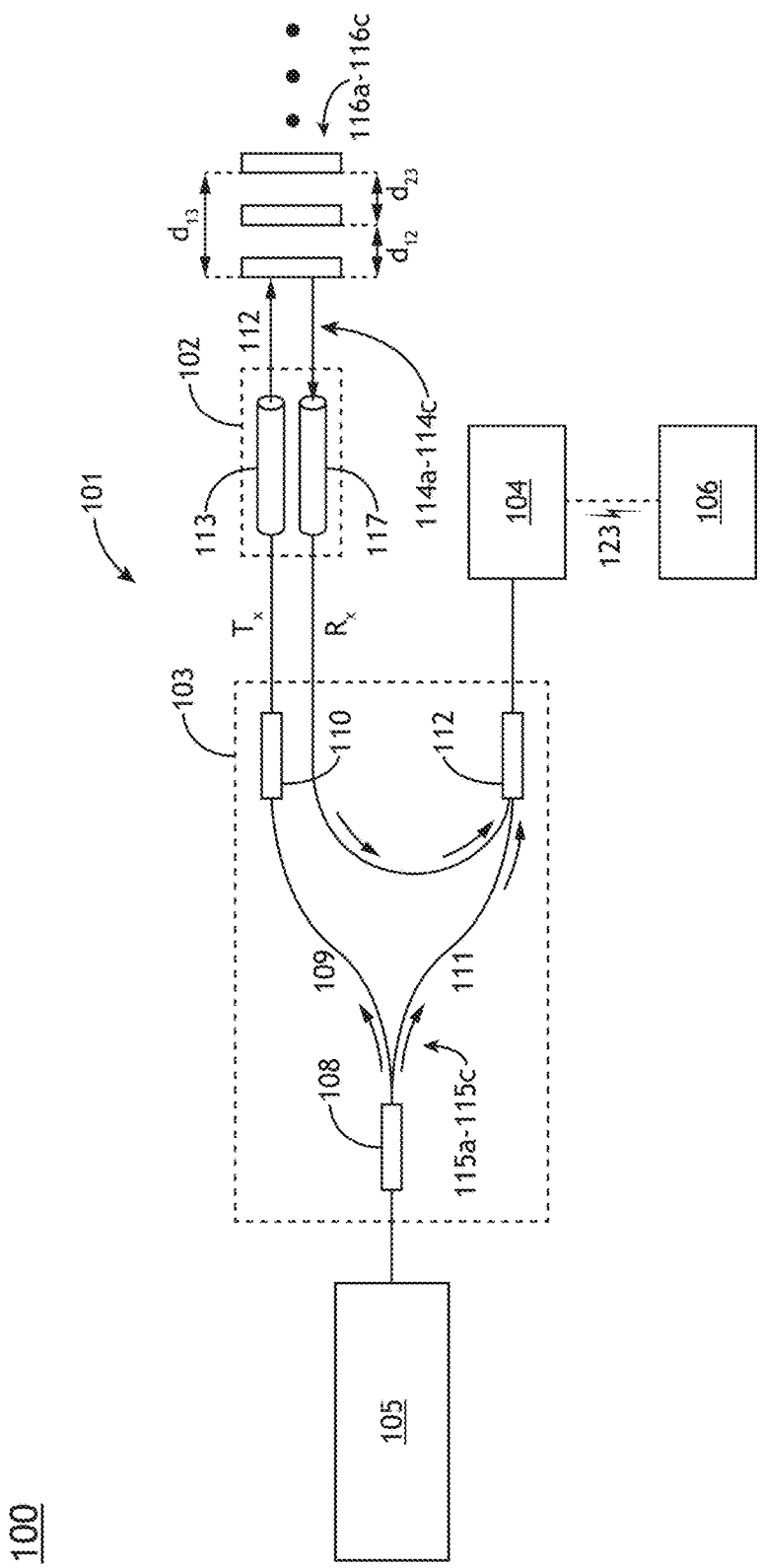
FIG. 1D is a block diagram illustrating a LADAR-based optical alignment system, in accordance with an embodiment of this disclosure.

FIGS. 1C and 1D illustrate a fiber optic based optical coupling assembly 103, in accordance with one or more embodiments of the present disclosure. Referring to FIG. 1C, in one embodiment, the optical coupling assembly 103 includes a splitter 108. In one embodiment, the splitter 108 is configured to split light from the laser 105 along a measurement path 109 and a reference path 111. For example, the reference illumination from the laser source 105 may include a copy of the frequency sweep used for measuring the optical surfaces of elements 116a-116c. In another embodiment, the reference illumination may include the one or more reference signals 115a-115c used for LADAR-based analysis. It is recognized herein that the optical surface measurement for each optical surface may be performed using the same reference signal or different reference signals. For instance, in one case, signals 115a-115c may be, but are not required to be the same. In another instance, signals 115a-115c may be, but are not required to be different.

In another embodiment, the probe illumination 112 is transmitted along the measurement path through the transmitting path (Tx) to the probe 102 and directed to the one or more optical surfaces of the optical elements 116a-116c of the given optical system. In another embodiment, the probe 102 collects scattered and/or reflected light from the one or more optical surfaces of the optical elements 116a-116c and directs the collected light along the receiver (Rx) path through circulator 110. It is noted herein that the embodiment of FIG. 1C includes a single probe configuration where probe illumination 112 and collected scattered/reflected light travel along a single optical fiber. In this regard, the transmitting path Tx and the receiving path Rx are along a single optical fiber. In another embodiment, light from the receiving path (Rx) is combined with the reference illumination (e.g., 115a-115c) from the reference path 111 of the system 100 via a combiner. In this regard, the reference illumination (e.g., copy of measurement illumination) is combined with the light reflected or scattered from the optical surfaces of the optical elements 116a-116c on the detector 104. In turn, the controller 106 may analyze the electronic signal 123 from the detector 104 to determine the distance and/or misalignment between two or more optical surfaces 118a-118b of the optical elements 116a-116e of the given optical system as described previously herein.

Referring to FIG. 1D, in one embodiment, the probe 102 of system 100 includes two or optical fibers. In one embodiment, the probe 102 includes a first optical fiber 113 configured to deliver probe illumination 112 to the optical surfaces 118a-118f of the optical elements 116a-116c. In another embodiment, the probe 102 includes a second optical fiber 117 configured to receive the measurement signals 114a-114c from the optical surfaces of the one or more optical elements 116a-116c of the given optical system. In this embodiment, the system 100 includes a dedicated receiving path Rx and a dedicated transmitting path Tx. The implementation of LADAR-based techniques are described in Z. W. Barber, W. R. Babbitt, B. Kaylor, R. R. Reibel, and P. A. Roos, "*Accuracy of active chirp linearization for broadband frequency modulated continuous wave ladar,*" Applied Optics, vol. 49, pp. 213-219, 2010, which is incorporated above by reference in the entirety. LADAR-based techniques are also described by P. A. Roos, R. R. Reibel, B. Kaylor, T. Berg, Z. W. Barber, and W. R. Babbitt, "*Ultra-broadband optical chirp linearization for precision metrological applications,*" Optics Letters, vol. 34, pp. 3692-3694, 2009, which is incorporated above by reference in the entirety. LADAR-based techniques are also described in Z. W. Barber, R. Reibel, P. Roos, et al., "*Characterization of an Actively Linearized Ultra-Broadband Chirp Laser with a Fiber-Laser Optical Frequency Comb*", Optics Letters, vol. 36, pp. 1152-1154, 2011, which is incorporated above by reference in the entirety.

Figure 2:
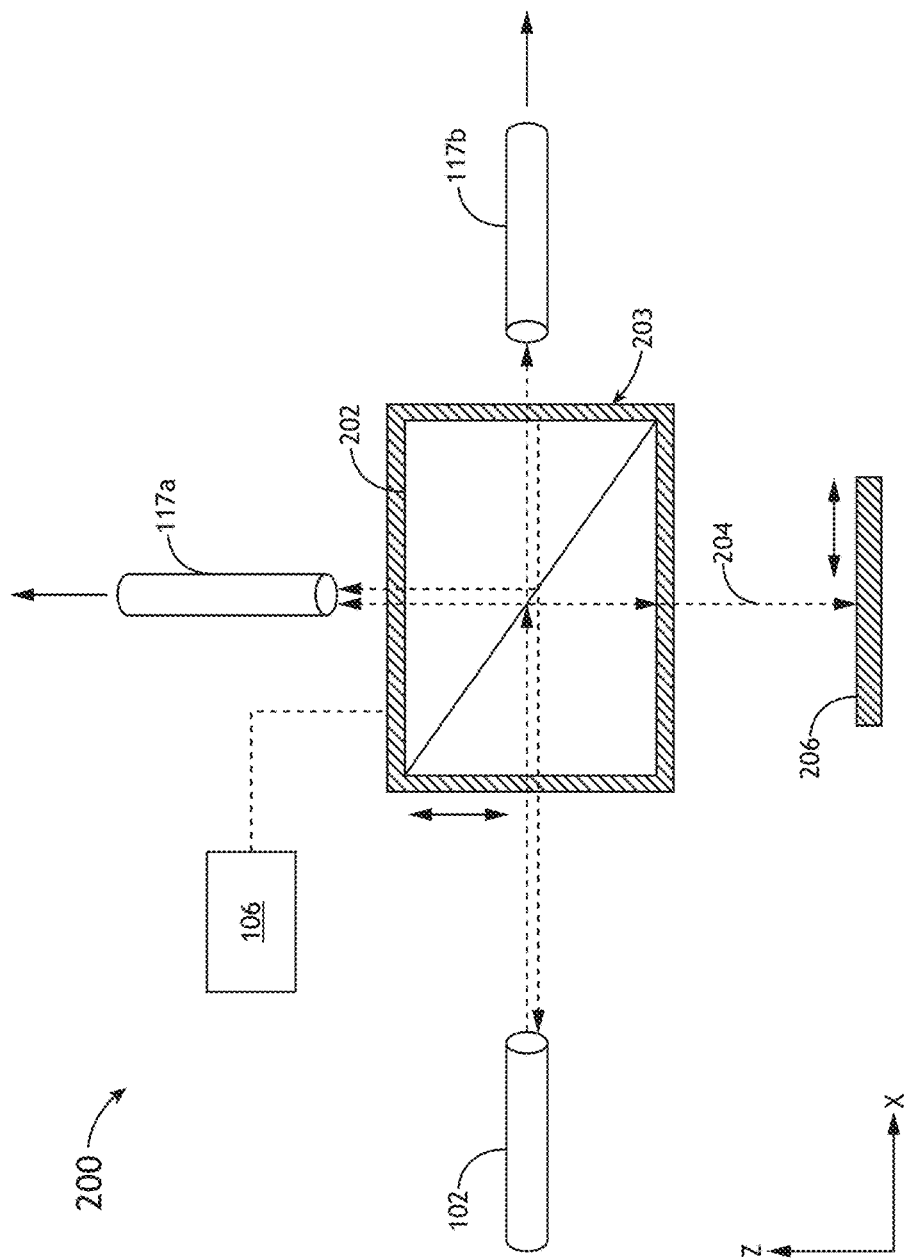
FIG. 2 is a simplified schematic view of a beam splitter of a LADAR-based optical alignment system suitable for use as a reference surface and probe beam scanning control, in accordance with an embodiment of this disclosure.

Referring to FIG. 2, a dedicated reference beam splitter 202 is illustrated in accordance with one or more embodiments of the present disclosure. It is noted that the beam splitter 202 may include one of the reference surfaces conceptually depicted in FIGS. 1A-1D previously herein.

In one embodiment, the beam splitter 202 (or beam splitters) are arranged to carry out probe beam scanning. For example, as shown in FIG. 2, the beam splitter 202 can be used to carry out one-dimension scanning. For instance, when the beam splitter 202 is actuated along the z-direction, the probe beam 204 is scanned along the x-direction. In one embodiment, the beam splitter 202 is disposed on an actuation stage 203 configured to translate the beam splitter along a selected direction, such as, but not limited to, the z-direction (e.g., parallel to direction of propagation of the probe beam 204). In another embodiment, the actuation stage 203 is communicatively coupled to the controller 106. In this regard, the controller 106 may direct the actuation stage 203 to scan the probe beam in one-dimension (e.g., x-direction) by selectively actuating the beam splitter along the z-direction.

In another embodiment, the system 100 includes a second beam splitter (not shown for purposes of clarity). The second beam splitter may be arranged to scan the probe beam in the y-direction (i.e., perpendicular to the x- and z-directions). In this regard, the second beam splitter may be placed in series with the first beam splitter 202 disposed on a second actuation stage, which is configured to selectively actuate the second beam splitter along a selected direction. For example, the second actuation stage may be communicatively coupled to the controller 106 and configured to scan the probe beam 204 in the y-direction by selectively actuating the second beam splitter in the x-direction. In this regard, the first beam splitter 202, the second beam splitter and the controller 106 may be used to selectively scan the probe beam in the x-y plane.

It is noted herein that actuation of the probe beam 204 relative to an optical element of the optical system 100 may also be achieved by actuating the probe 102 and is not limited to the actuation of the beam splitter actuation described above.

In another embodiment, the beam splitter may serve as a dedicated reference optical element in the given optical system.

In another embodiment, as shown in FIG. 2, the system 100 includes multiple LADAR detectors 117a, 117b. For example, as shown in FIG. 2, the first and second detectors 117a, 117b may detect light reflected from an optical surface of the system 100 independent from probe 102. In the case where probe 102 includes a LADAR receiving channel (as in FIG. 1A), the embodiment of FIG. 2 may include three collection channels in probe 102, detector 117a and 117b. It is noted herein that the detectors 117a, 117b are not a requirement of the present disclosure and the present disclosure is not limited to the use of only two detectors 117a, 117b.

As shown in FIG. 2, the four surfaces of the beam splitter 202 may serve as dedicated reference surfaces to determine a relative distance to a selected test optical surface, such as the surface of optical element 206. In one embodiment, the scanning function of the beam splitter 202 and the LADAR system 101 allow the system 100 to perform a mapping and characterization of the beam splitter 202 itself. In another embodiment, the scanning function and LADAR system 101 allows for the tracking of the beam splitter position and orientation during a scan measured relative to an arbitrary start position.

Figure 3A:
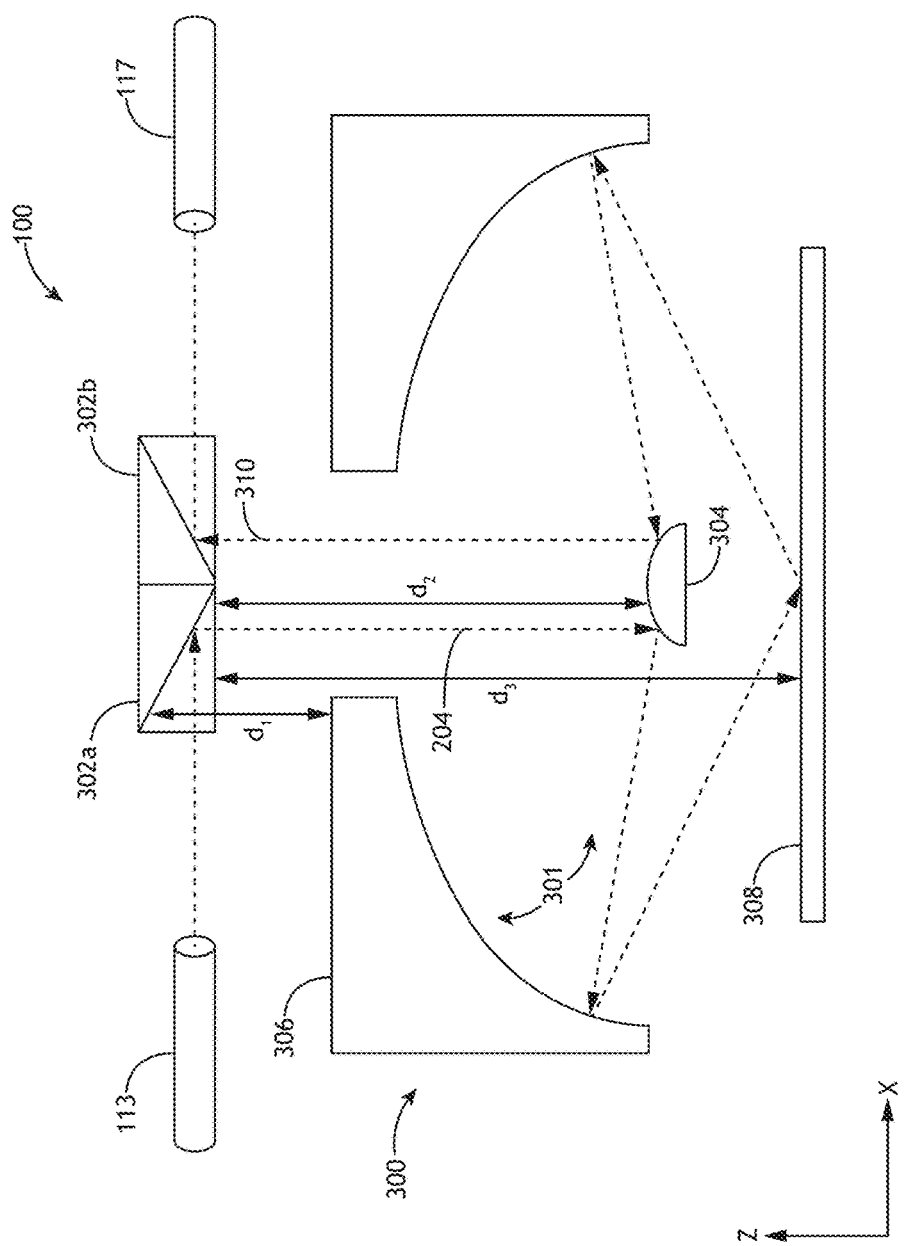
FIG. 3A is a simplified schematic view of an optical system characterized with the LADAR-based optical alignment system, in accordance with an embodiment of this disclosure.
Figure 3B:
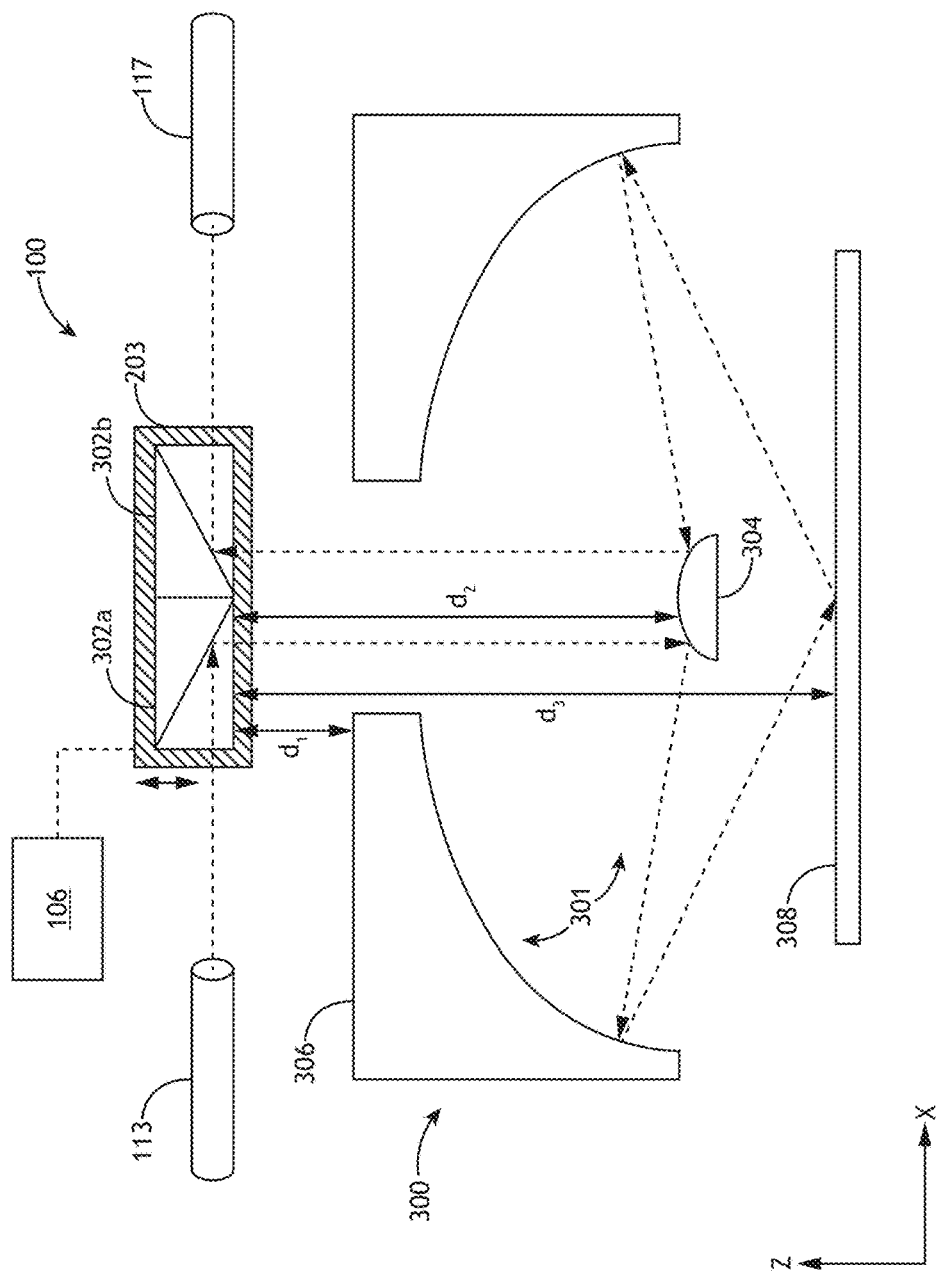
FIG. 3B is a simplified schematic of an optical system characterized with the LADAR-based optical alignment system with position control of one or more beam splitters, in accordance with an embodiment of this disclosure.
Figure 3C:
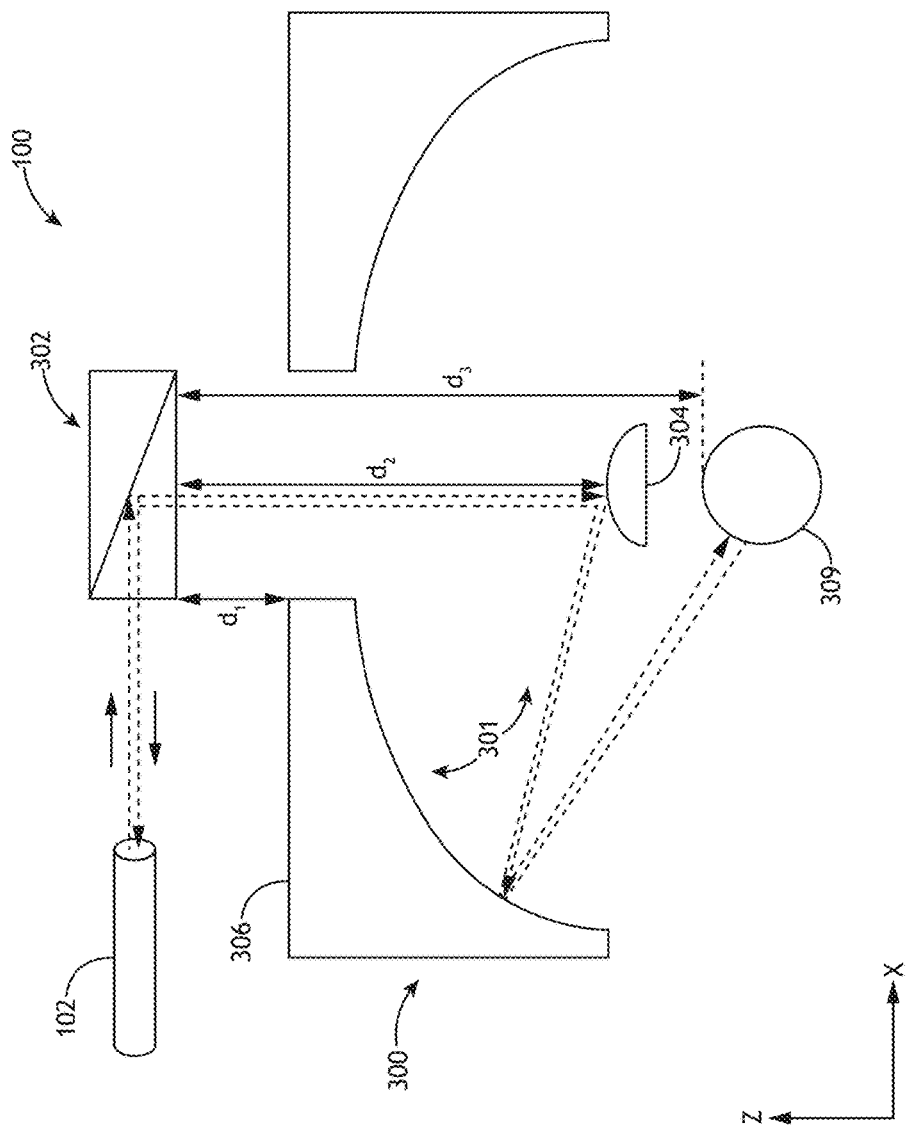
FIG. 3C is a simplified schematic of an optical system with a reflective spherical reference element characterized with the LADAR-based optical alignment system with position control of one or more beam splitters, in accordance with an embodiment of this disclosure.

FIGS. 3A-3C illustrate the implementation of LADAR-based analysis to characterize one or more optical elements of an optical system, in accordance with one or more embodiments of the present disclosure. In one embodiment, as shown in FIG. 3A, the LADAR system 101 may be used to characterize an optical system 300 including a reflective objective 301 and a reflective reference mirror 308 placed at the field plane of the optical system. In one embodiment, the objective lens 301 includes a small defocusing mirror 304 and a large focusing mirror 306.

In one embodiment, the system 100 includes a dedicated probe 113 for delivering probe illumination, a pair of beam splitters 302a, 302b and a dedicated LADAR detector 117 (or receiver). It is noted that the pair of beam splitters 302a, 302b may be used to both scan the probe beam 204 and serve as one or more reference surfaces to determine misalignment of one or more test surfaces of the optical system 300. In one embodiment, the detector 117 and optical system 100 are arranged such that the detector 117 receives at least a portion of the light signal 310 reflected from the reference mirror 308 and through the objective 301. It is further noted that the probe/detection configuration is not limited to dedicated probe 113 and detector 117 depicted in FIGS. 3A-3C, which are provided merely for illustrative purposes. For example, the system 100 may include a pair of probe-detector assemblies 102 suitable for both delivering probe illumination and collected reflected/scattered illumination, as that depicted in FIG. 1A.

In one embodiment, the probe beam 204 is directed by first beamsplitter 302a onto the small defocusing mirror 304. Then, the probe illumination follows an optical path to the large focusing mirror 306 and to the reference mirror 308 where the illumination is reflected back to the focusing mirror 306. In turn, the reflected illumination travels back to the small defocusing mirror 304 and is directed to the second beam splitter 302b. The second beamsplitter 302b then directs the reflected illumination to the detector 117. It is noted that the detector 117 is optically coupled to the LADAR sub-system 101 (not depicted in FIG. 3A for purposes of clarity). In one embodiment, the LADAR sub-system 101 and controller 106 may then be used to determine the total length of the optical measured relative to the characterized surfaces of beamsplitters 302a, 302b.

In another embodiment, the LADAR sub-system 101 and controller 106 may be used to determine the relative distance between the first and/or second beamsplitters 302a, 302b and one or more optical surfaces of the optical system 300 as described previously herein. In another embodiment, controller 106 may then detect a misalignment of one or more optical surfaces of the optical system 300 as described previously herein.

In one embodiment, the beamsplitters 302a, 302b are placed in the pupil plane, as depicted in FIGS. 3A-3C. In another embodiment, the probe beam 204 may be scanned across the optical plane as a function of x-y position across the pupil plane. For example, as shown in FIG. 3B, the beamsplitters 302a and/or 302b may be, but are not required to be, disposed on actuation stage 203. In this regard, and as described previously herein, the actuation stage 203 and beamsplitter 302a may be used to scan the probe beam 204 along the x-direction by actuating the beamsplitter 302a in the z-direction. In addition, an additional beamsplitter (not shown) may be used to provide for scanning in the y-direction, which when combined with the x-direction scanning of stage 203 provides full characterization of the optical path of the optical system 300 as a function of x-y position in the pupil plane. In another embodiment, the probe beam 204 may be translated relative to the beam splitter 302a/302b and the various optical elements (e.g., focusing mirror 306, defocusing mirror 304, mirror flat 308, spherical mirror 309 and etc.) by actuating the probe 113 and/or the LADAR detector 117.

It is recognized herein that in the case of a well-aligned imaging objective lens, the optical path of the optical system 300 should remain substantially constant. As such, the optical path may be monitored continuously for an indication of a changing optical path length, which is indicative of a misalignment in the optical system 300.

Prior to utilizing the optical system, the optical alignment system 100 may characterize the optical system 300 through the acquisition of one or more initial parameters of the optical system 300. In this regard, the one or more initial parameters may be monitored throughout the use of the optical system 300.

In one embodiment, the system 100 may measure a relative distance $d_1$ between the reference beamsplitter 302a and/or 302b and the back surface of the large focusing mirror 306. In another embodiment, tilt of the focusing mirror 306 may be measured by measuring the distance between the beam splitter 302a and the back surface of the focusing mirror 306 and the distance between the beam splitter 302b and the back surface of the focusing mirror 306.

In another embodiment, the system 100 may measure a relative distance $d_2$ between the reference beamsplitter 302a and/or 302b and the small defocusing mirror 304. For example, the relative distance $d_2$ between the reference beamsplitter 302a and/or 302b and the small defocusing mirror 304 may be accomplished by probe 113 transmitting the probe beam to the center portion of the small defocusing mirror 304.

In another embodiment, the system 100 may measure a relative distance $d_3$ between the beamsplitter 302a and/or 302b and the reference mirror 308. For example, the system 100 may measure a relative distance d3 between the beamsplitter 302a and/or 302b and the reference mirror 308 by probe 113 transmitting the probe beam through a gap between the small defocusing mirror 304 and the large focusing mirror 306.

In one embodiment, a change in optical path of the optical system 300 may include a misalignment of the objective 301. A misalignment of the objective lens 301 can be described as a relative shift between the small defocusing mirror 304 and the large focusing mirror 306 in the x-, y- and z-directions as well as tip and tilt.

In another embodiment, a change in optical path of the optical system 300 may include a focus error. For example, the change in optical path may be a result of a change in the reference mirror 308 in the z-direction relative to the objective lens 301.

In another embodiment, a change in optical path of the optical system 300 may result from a change in the optical quality of one or more of the components of the system 300. For example, a change in optical path of the optical system 300 may result from a deviation of the actual mirror shapes from optical prescription.

Referring to FIG. 3C, the optical system 300 includes a spherical reference 309, in accordance with one or more embodiments of the present disclosure. In one embodiment, the optical system 300 to be characterized by the optics alignment system 100 includes the sphere-shape reflective element 309 in place of the flat mirror 308 of FIG. 3A. In one embodiment, the sphere-shaped reflective element 309 is positioned such that the center of the sphere is located at the focus of the optical system 300. In another embodiment, the sphere 309 is sized to fit substantially under the defocusing mirror 304. In this regard, illumination from the probe 102 impinging on the sphere (from defocusing mirror 304 and large focusing mirror 306) is double passed back to the probe, following substantially the same optical path as the probe path. In this regard, the probe 102 may serve for both probe illumination delivery and collection of light reflected from the optical system 300.

It is noted herein that the reflective reference element 308, 309 is not limited to the flat and spherical elements depicted in FIGS. 3B and 3C. It is recognized herein that any reference element suitable for generating a flat field output is suitable for implementation as a reference element in optical system 300. For example, for an imaging system the reference element may include a flat mirror or a spherical mirror. In both these cases, a flat field may be generated at the test plane where an interferometer can be used to evaluate this field quality and, thus, the quality and alignment of the optical system.

It is further noted that the use of LADAR allows the use of any known shape. By way of example, an imperfectly compensated objective including a sphere as a reference element, as shown in FIG. 3C may be utilized. It is noted that the design of an imaging objective with strong aberrations represents a practical implementation context as the aberrations may all be compensated for using, for example, a tube lens. It is noted, however, that such an objective cannot be analyzed with the use of a traditional interferometer as a result of these designed-in aberrations. The use of LADAR system, however, would accurately illustrate the field distribution that can then be compared to the design.

It is further noted that the use of multiple probes, such as two or three probes, similarly positioned, but spaced radially (e.g., 120 degrees in case of 3 probes or 90 degrees in case of 2 probes) could be used to facilitate precise centering of optical elements in addition to spacing. It is recognized herein that the sensitivity to this positioning is dependent on the design of the optical system, the surface form/figure/polish and where the optical element is in the manufacturing process.

Figure 4A:
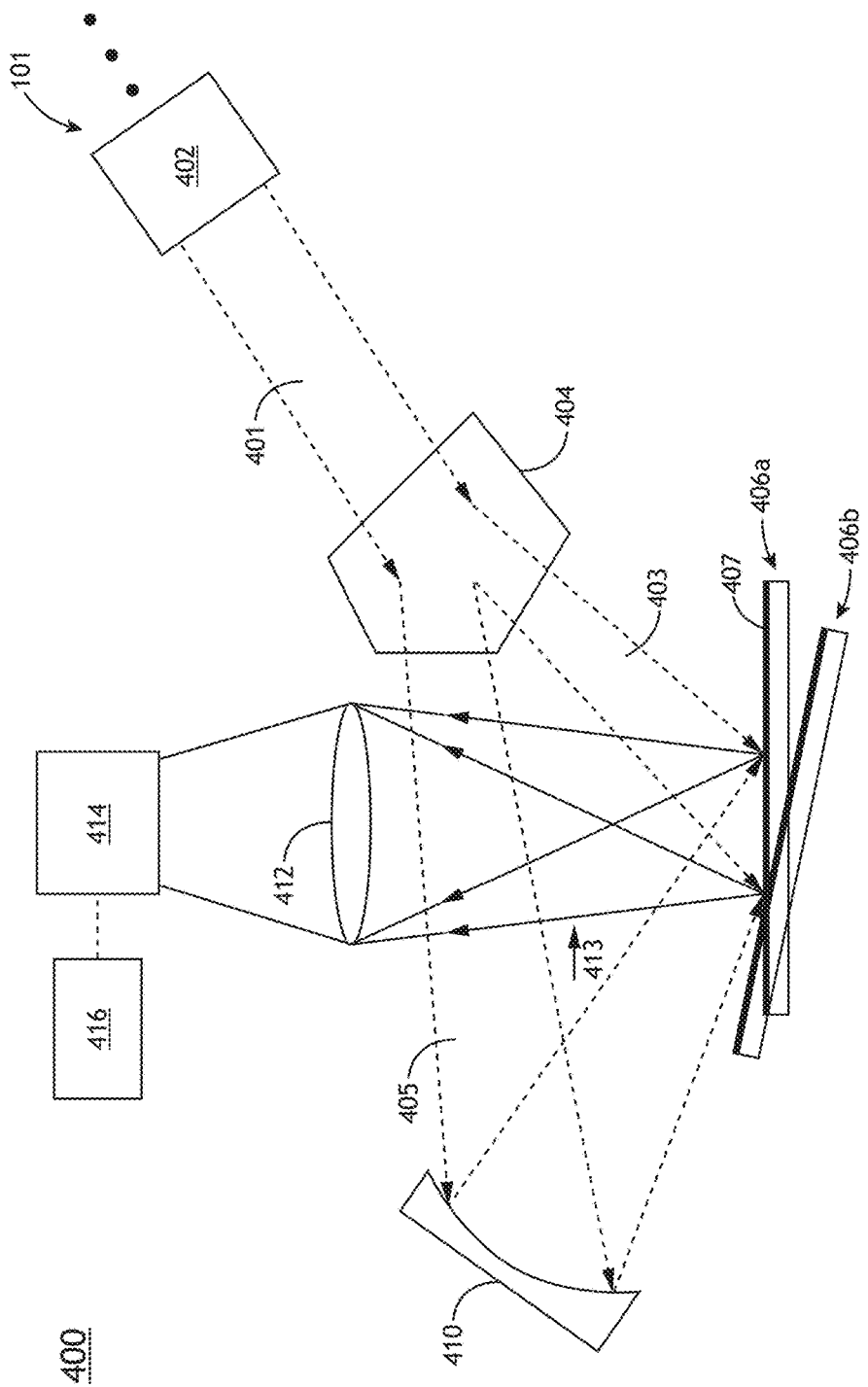
FIG. 4A is a simplified schematic view of a system for characterization of one or more reflective optical elements of an optical system, in accordance with an embodiment of this disclosure.

FIG. 4 illustrates an optical characterization system 400, in accordance with one or more additional embodiments of the present disclosure. The system 400 is directed to measuring profiles of large optical components. For example, the system 400 may be particularly advantageous when measuring a profile of an aspherical optical element, which is not measurable using traditional interferometric approaches. It is noted herein that embodiments of system 400 are directed to the use of LADAR-based frequency scanning and imaging modes.

In one embodiment, the system 400 includes a LADAR sub-system including LADAR probe 402 configured to generate a probe beam 401. In another embodiment, the system 400 includes a scattering target 407 having a scattering layer 407. In one embodiment, the scattering target 407 is disposed on a tilt control stage (not shown), which is configured to orient that scattering target at one or more tilt values. For example, as shown in FIG. 4, the system 400 may acquire measurements at a first tilt 406a and a second tilt 406b (and so on).

In another embodiment, the system 400 includes a beam splitter 404 configured to split the probe beam into a reference beam 403 and a measurement beam 405. In another embodiment, the beam splitter 404 is arranged to direct the reference beam 403 to the scattering target 407. In another embodiment, the beam splitter 404 is arranged to direct the measurement beam 405 to an optical element of the optical system being characterized, such as, but not limited to, focusing target 410. For example, the focusing target may include, but is not limited to, an aspherical reflective optical element of the optical system to be characterized. In another embodiment, system 100 is arranged such that the focusing target directs the measurement beam 405 to the scattering target 407.

In one embodiment, the measurement beam 405 and the reference beam 403 forms an interference pattern at the surface of the scatter target 407. In another embodiment, illumination 413 from the interference pattern is scattered by the surface of the scattering target 407 and is directed to the imaging detector 414. For example, the system 400 includes lens 412 for collecting and focusing scattered light from the interference pattern formed on the surface of the scattering target 407 onto the imaging detector. In another embodiment, the detector 414 is configured to image the interference pattern using the illumination 413 scattered from the surface of the scattering target 407.

In another embodiment, the system 400 includes a controller 416 communicatively coupled to the detector 414. In one embodiment, the controller 416 is configured to receive imagery data of one or more interference patterns scattered from the surface of the scattering target 407. In another embodiment, the controller 416 is configured to determine a shape of the focusing target 410 based on the received imagery data of one or more interference patterns scattered from the surface of the scattering target 407. For example, the controller 416 may execute program instructions suitable for performing optical modeling and fitting of the measured imagery data from detector 414 to a selected optical model to generate a measured shape of the optical element 410. It is noted herein that the probe 402 and detector 414/controller 416 form a portion of a LADAR system suitable for calculating optical paths based on the sensitivity of the given interference pattern to the probe light wavelength. In this regard, the system 400 may implement LADAR analysis techniques to monitor the shape of one or more optical elements (e.g., focusing target) of the optical system and then use of one or more optical models to calculate a shape of the optical surface of the one or more optical elements. It is further noted that the various embodiments described previously herein with respect to FIGS. 1A-3C should be interpreted to extend to system 400.

It is further noted that the system 400 may incorporate a number of additional pieces of information to improve upon the characterization of the optical element 410. In one embodiment, the controller 416 may receive a user-inputted expected shape of the optical element 410. In this embodiment, the controller 416 may then determine a shape of the optical element 410 based on the received imagery data of one or more interference patterns from the detector 414 and the expected user-inputted shape of the optical element. In this regard, a user may input an optical model of the optical element 410 including the expected shape of the tested component and then the controller 416 may calculate smallest possible deviation (or an acceptable deviation) from this shape that would satisfy measured data from the detector 414.

In one embodiment, the controller 416 may direct the tilt adjustment stage (not shown) to selectively adjust the tilt of the scattering target 407. In this regard, the controller 416 may acquire a set of interference pattern measurements at a series of tilt values (e.g., first tilt 406a, second tilt 406b, third tilt (not shown), fourth tilt (not shown) and so on). Further, the controller 416 determines a shape of the optical element 410 based on the set of interference patterns measured at different tilt values. It is recognized herein that a combination of data measured at three or more positions may allow the calculation of a unique shape profile of the optical element 410. It is recognized herein that the present disclosure is not limited to the variation of tilt in determining the shape profile. It is noted that any approaches used to vary the probe beam paths may be used to determine the shape of the optical element 410. For example, in addition to controlling tilt of the scattering target 407, they system 400 may control the vertical position of the scattering target, the angle of the reference beam, the angle of the probe beam, the position or orientation of the beamsplitter or the position or orientation of the optical element 410.

It is noted herein that the scattering target 407 may define, or at least impact, the measurement accuracy. As such, in one embodiment, the roughness of the scattering target 407 is controlled such that it is approximately ¼ of the size of probe light wavelength.

In another embodiment, the interference patterns may be created directly on the detector 114. In this embodiment, the detector 114 is positioned at the location of the scattering target 407 in FIG. 4. In this embodiment, no imaging lens or scattering target is required. This approach may allow for improved accuracy since there is not a need for a scattering target with inherent surface roughness.

It is further noted that system 400 may include any number of additional optical elements. For example, the system 400 may include one or more collection lenses or mirrors for collecting light from a defocusing surface. In this regard, one or more optical components may be used to achieve a required spot size on the detector 414 necessary to carry out the shape measurement of system 400.

In another embodiment, the system 400 may perform one or more calibration steps. For example, the system 400 can be calibrated with an optical element having a known shape. For instance, the test optical element 410 (e.g., aspheric mirror) can be replaced with a well characterized flat mirror. The quality of this flat mirror can be verified with other methods, such as an interferometer. Alternatively, the LADAR sub-system (e.g., including probe 402) may be operated in a traditional interferometer mode.

It is recognized herein that there are a number of data processing approaches that exist for identifying one or more parameters of the optical element 410. For example, the controller 416 may execute a data processing routine optimized for identifying one or multiple parameters, which described the measured profile and/or the complete measurement of the profile. For instance, in the case of single parameter analysis, the single parameter may include the tilt of the optical element 410. It is further noted that measuring a limited number of the parameters may allow for improved accuracy of the measurement and effectively eliminate limitations introduced by the scattering target roughness. For example, when measuring tilt, the roughness information can be averaged over the entire image.

Figure 4B:
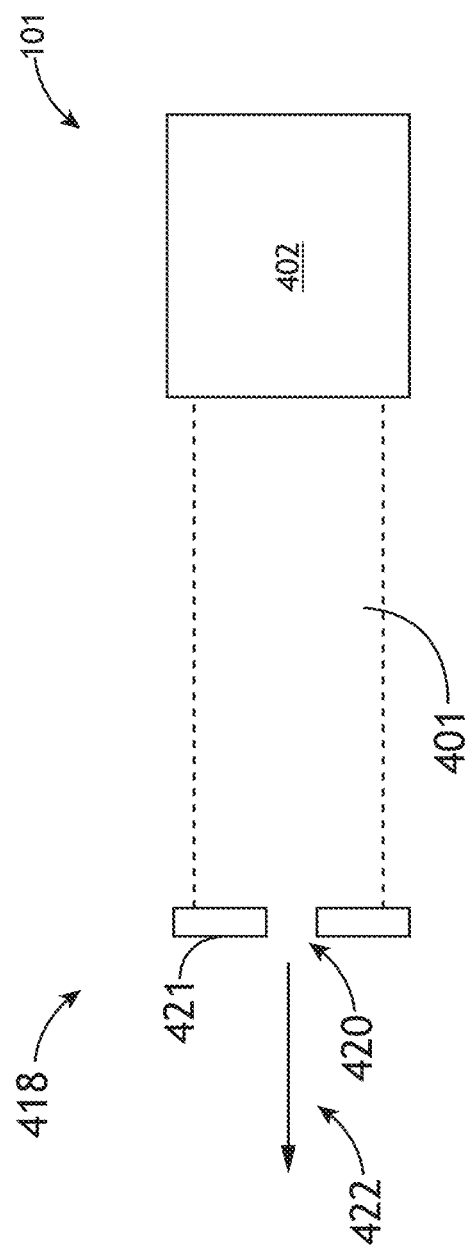
FIG. 4B is a simplified schematic view of a beam-selection system of the system for characterization of one or more reflective optical elements of an optical system, in accordance with an embodiment of this disclosure.

Referring to FIG. 4B, in one embodiment, the system 400 includes a beam-selection system 418. In one embodiment, the beam-selection system 418 is implemented to switch the system 400 between imaging and beam-scanning modes. For example, the beam-selection system 418 includes pinhole aperture 420. In this regard, the system 400 may operate in a beam scanning mode by placing an aperture assembly 421 in the probe beam 401 and controlling the position of the pinhole across the beam 401 as the system 400 measures location and optical path for the transmitted portion 422 of the beam 401. It is noted that the location of the reflected beam on the scattering target 407 (or directly on detector 414) provides additional information about measured shape of the optical element 410. This may be particularly advantageous when measuring greatly curved surfaces where different parts of the tested surface reflect light on the same location on the scattering target 407. In addition, the beam-selection system may select any portion of the probe beam (i.e. half beam, etc.) and is not limited to a pinhole. In another embodiment, the aperture assembly 421 may be actuated into and out of the beam using an actuation stage, which may be controlled by controller 416.

It is further noted that the shape measurements of system 400 may be complemented with local scattering measurements to remove accuracy limitations related to the roughness of the scattering target 407. For example, averaging the signal over a selected area on the scattering target 407 averages out scattering structure and improves accuracy of the global tested component profile.

Those having skill in the art will appreciate that there are various vehicles by which processes and/or systems and/or other technologies described herein can be embodied (e.g., hardware, software, and/or firmware), and that the preferred vehicle will vary with the context in which the processes and/or systems and/or other technologies are deployed. In some embodiments, various steps, functions, and/or operations are carried out by one or more of the following: electronic circuits, logic gates, multiplexers, programmable logic devices, ASICs, analog or digital controls/switches, microcontrollers, or one or more controllers (e.g., controller 106 or 416). The controller 106 or controller 406 may include a computing system including, but not limited to, a personal computing system, mainframe computing system, workstation, image computer, parallel processor, or any other computational/control device known in the art. In general, the term "controller" (e.g., controller 106 or 416) is broadly defined to encompass any device having one or more processors, which execute program instructions from a carrier medium (e.g., memory). Program instructions implementing the various methods and steps such as those described herein may be transmitted over or stored on carrier media. A carrier medium may include a transmission medium such as a wire, cable, or wireless transmission link. The carrier medium may also include a storage medium such as a read-only memory, a random access memory, a solid state memory, a magnetic or optical disk, a magnetic tape and the like.

All of the methods described herein may include storing results of one or more steps of the method embodiments in a storage medium. The results may include any of the results described herein and may be stored in any manner known in the art. The storage medium may include any storage, or carrier, medium described herein or any other suitable storage medium known in the art. After the results have been stored, the results can be accessed in the storage medium and used by any of the method or system embodiments described herein, formatted for display to a user, used by another software module, method, or system, etc. Furthermore, the results may be stored "permanently," "semi-permanently," temporarily, or for some period of time. For example, the storage medium may be random access memory (RAM), and the results may not necessarily persist indefinitely in the storage medium.

Although particular embodiments of this invention have been illustrated, it is apparent that various modifications and embodiments of the invention may be made by those skilled in the art without departing from the scope and spirit of the foregoing disclosure. Accordingly, the scope of the invention should be limited only by the claims appended hereto.

What is claimed is:

1. An apparatus for alignment of one or more optical elements of an optical system comprising:
a LADAR sub-system including:
a laser source;
a probe configured to deliver probe illumination from the laser source to a first optical surface of the optical system and an additional optical surface of the optical system, wherein the first optical surface is different from the additional optical surface, the probe further configured to receive a first measurement signal from the first optical surface and an additional measurement signal from the additional optical surface of the optical system;
an optical coupling assembly configured to direct the probe illumination from the laser source to the probe, the optical coupling assembly further configured to combine the first measurement signal and the additional measurement signal from the probe with one or more reference signals from the laser source to form a first combined signal and an additional combined signal; and
a detector configured to receive the first combined signal and the additional combined signal from the optical coupling assembly; and
a controller communicatively coupled to the detector, wherein the controller is configured to:
receive one or more electronic signals from the detector indicative of at least one of the first combined signal or the additional combined signal; and
determine a relative distance between the first optical surface and the additional optical surface based on the received one or more electronic signals from the detector indicative of at least one of the first combined signal or the additional combined signal.

2. The apparatus of claim 1, wherein the controller is further configured to identify a misalignment between the first optical surface and the additional optical surface based on the determined relative distance between the first optical surface and the additional optical surface.

3. The apparatus of claim 1, wherein the first optical surface is a reference surface.

4. The apparatus of claim 3, wherein the first optical surface is a dedicated reference surface.

5. The apparatus of claim 3, wherein the first optical surface is an operational portion of optical surface of the optical system.

6. The apparatus of claim 1, wherein the additional optical surface is a test surface of the optical system.

7. The apparatus of claim 1, wherein the probe includes an optical fiber configured to deliver probe illumination to the first optical surface and the additional optical surface, the optical fiber further configured to receive the first measurement signal from the first optical surface and the additional measurement signal from the additional optical surface of the optical system.

8. The apparatus of claim 1, wherein the probe includes:
a first optical fiber configured to deliver probe illumination to the first optical surface and the additional optical surface; and
an additional optical fiber configured to receive the first measurement signal from the first optical surface and the additional measurement signal from the additional optical surface of the optical system.

9. The apparatus of claim 1, further comprising:
one or more actuation stages communicatively coupled to the controller, wherein at least one of the first optical surface or the additional optical surface is disposed on the one or more actuation stages, wherein the controller is configured to adjust a position of at least one of the first optical surface or the additional optical surface to compensate for a detected misalignment, the detected misalignment based on the determined relative distance between the first optical surface of the optical system and the additional optical surface of the optical system.

10. The apparatus of claim 1, wherein the laser source comprises:
a tunable laser source.

11. The apparatus of claim 10, wherein the tunable laser source comprises:
  at least one of a diode laser or a laser configured to emit harmonic generated laser light.

12. The apparatus of claim 1, wherein the detector comprises:
  at least one of a photodiode, a charge-coupled device, a time delay integration-charge-coupled device or a photomultiplier tube.

13. The apparatus of claim 1, wherein the optical system comprises at least one of a vacuum ultraviolet or extreme ultraviolet optical system.

14. The apparatus of claim 1, wherein the optical system is an imaging optical system.

15. The apparatus of claim 1, wherein the optical system is a non-imaging optical system.

* * * * *